United States Patent [19]
Arvidsson et al.

[11] Patent Number: 5,231,887
[45] Date of Patent: Aug. 3, 1993

[54] DEVICE IN A FORCE ACTUATOR

[75] Inventors: Thomas Arvidsson, Flygarevägen; Leif Westgren, Sönnervång, both of Sweden

[73] Assignee: SAB Wabco Holdings B.V., Sweden

[21] Appl. No.: 861,838

[22] PCT Filed: Dec. 18, 1990

[86] PCT No.: PCT/SE90/00845
§ 371 Date: Jul. 23, 1992
§ 102(e) Date: Jul. 23, 1992

[87] PCT Pub. No.: WO91/10082
PCT Pub. Date: Jul. 11, 1991

[30] Foreign Application Priority Data
Dec. 21, 1989 [SE] Sweden .................... 8904309

[51] Int. Cl.⁵ .................... F16H 27/02; F16D 65/27
[52] U.S. Cl. .................... 74/88; 188/72.1; 188/163; 188/196 F; 310/26
[58] Field of Search .................... 74/88, 128; 188/72.1, 188/163, 196 F; 310/26

[56] References Cited

U.S. PATENT DOCUMENTS

| | | | |
|---|---|---|---|
| 3,543,888 | 12/1970 | Erdmann | 188/196 F |
| 4,334,602 | 6/1982 | Armour et al. | 192/103 F |
| 4,854,424 | 8/1989 | Yamatoh et al. | 188/72.1 |
| 4,927,334 | 5/1990 | Engdahl et al. | 310/26 X |
| 4,953,668 | 9/1990 | Severinsson | 188/171 X |

Primary Examiner—Allan D. Herrmann
Attorney, Agent, or Firm—Laurence R. Brown

[57] ABSTRACT

A reciprocating axial movement of a drive member (18) in a force actuator is generated by a prestressed tool (17) of Terfenol material being exposed to a pulsating magnetic field. The reciprocating movement is transformed to an axial movement in an application direction of a push rod (21) coaxial therewith. The drive member and the push rod are connected by a connection member (22), which is in self-locking thread engagement with a drive member and the push road and is subjected to a torque from a spiral spring (23) for its rotation during the idle stroke of the reciprocating movement in the direction for advancing the push rod in the application direction.

8 Claims, 2 Drawing Sheets

DEVICE IN A FORCE ACTUATOR

TECHNICAL FIELD

This invention relates to a device in a force actuator for transforming a reciprocating axial movement of a drive member to an axial movement in an application direction of a push rod coaxial therewith.

TECHNICAL BACKGROUND

In a number of different ways it is possible to accomplish a reciprocating movement or force, which it may be desirable to transform into a unidirectional movement or force. A relatively recently developed technique is to utilize materials having magnetostrictive properties. Magnetostriction means that a material change its dimensions when exposed to a magnetic field.

Materials with such properties are typically alloys with rare earth metals, an alloy with terbium and iron being available under the name Terfenol. This material Terfenol has a very high magnetostriction, namely up to 0.2% at a magnetic field with a field strength of appr. 3000 oersted, and a very fast response.

Due to the magnetostriction a Terfenol rod exposed to a pulsating magnetic field and prestressed for accomplishing a return to original shape will have a reciprocating length and accordingly exert a reciprocating force.

In order to utilize this oscillating movement or force in a practical force actuator this movement has to be transformed into a unidirectional movement of a push rod or the like in the actuator.

THE INVENTION

In a force actuator of the kink described above this may according to the invention be accomplished in that the drive member and the push rod are connected by means of a connection member, which is in self-locking thread engagement with the drive member and/or the push rod and is subjected to a torque for its rotation during the idle stroke of the reciprocating movement in the direction for advancing the push rod in the application direction.

In a first practical embodiment a connection ring is in thread engagement with external threads on the drive member and is subjected to a torque exerted by a prestressed spring. In a preferred embodiment the connection ring is in thread engagement with oppositely directed threads on the drive member and the push rod.

In a second practical embodiment a connection rod is in tl read engagement with oppositely directed internal threads in the drive member and the push rod and is subjected to a torque excerted by a prestressed spring.

In these embodiments a clock or spiral spring is arranged between the connection member and an outer ring, which is rotatable, preferably my means of an electric motor, for prestressing the spring.

BRIEF DESCRIPTION OF THE DRAWINGS

The invention will be described in further detail below reference being made to the accompanying drawings, in which.

DETAILED DESCRIPTION OF EMBODIMENTS

Figure 1:
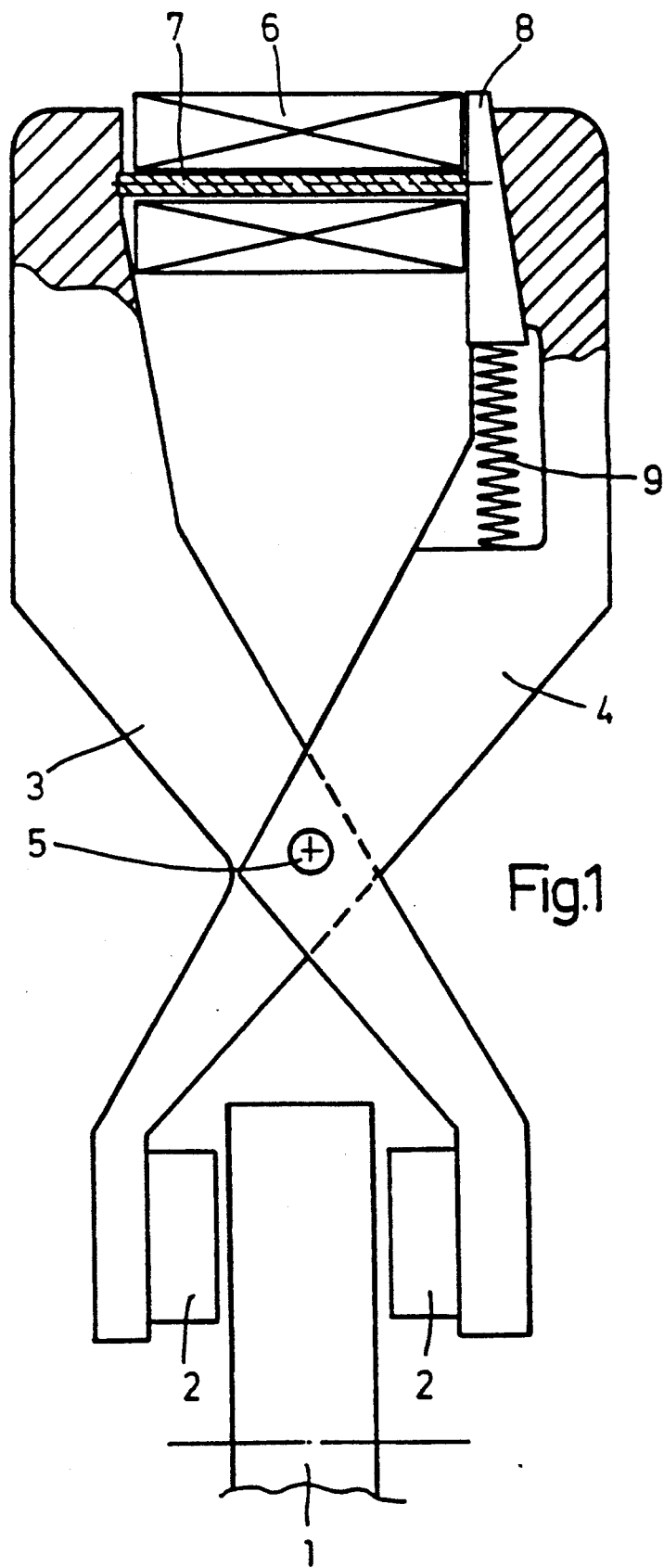
FIG. 1 shows a rather simple embodiment of a disc brake with a actuator illustrating the principle underlying the invention.

FIG. 1 shows a simple disc brake arrangement, which is more intended to illustrate a principle than a practical embodiment.

The arrangement is intended to brake a rotating disc 1 by means of brake pads 2 arranged at the ends of two caliper levers 3 and 4 pivotally attached to each other at 5. The braking action is obtained by pushing the ends of the levers 3 and 4 opposite the pads 2 apart.

In the simple arrangement according to FIG. 1 this is accomplished by an electric coil 6 surrounding a rod 7 of the material called Terfenol, with the characteristics to prolong itself up to say 0.2% of its length when subjected to a certain magnetic field (from the coil 6). The rod 7 is connected to the lever 3 to the left in FIG. 1 and cooperates with the lever 4 to the right via a wedge 8. The wedge 8 is biassed upwards by a compression spring 9 and cooperates with a wedge surface in the lever 9.

The coil 6 is electrically activated in a pulsating manner. The mass inertia of the levers 3 and 4 is considerably larger than that of the rod 7 and the self-locking mechanism constituted by the wedge 8 and spring 9. Each time the coil 6 is activated, the rod 7 is slightly extended with the result that the levers 3 and 4 are pressed apart. When the other the rod 7 returns to its original length due to the de-activation of the coil 6, the wedge 8 will be free for a short while and will be pushed upwards in FIG. 1 by its spring 9. Depending on the frequency of the pulsating currency supplied to the coil 6 and the geometry of the arrangement, the brake pads 2 will be applied to the disc 1 with a certain force and speed.

For releasing the brake the coil may again be activated by a pulsating current, but the wedge 8 will in this instance be pushed back (against the force of the compression spring 9) by for example a solenoid (not shown).

Figure 2:
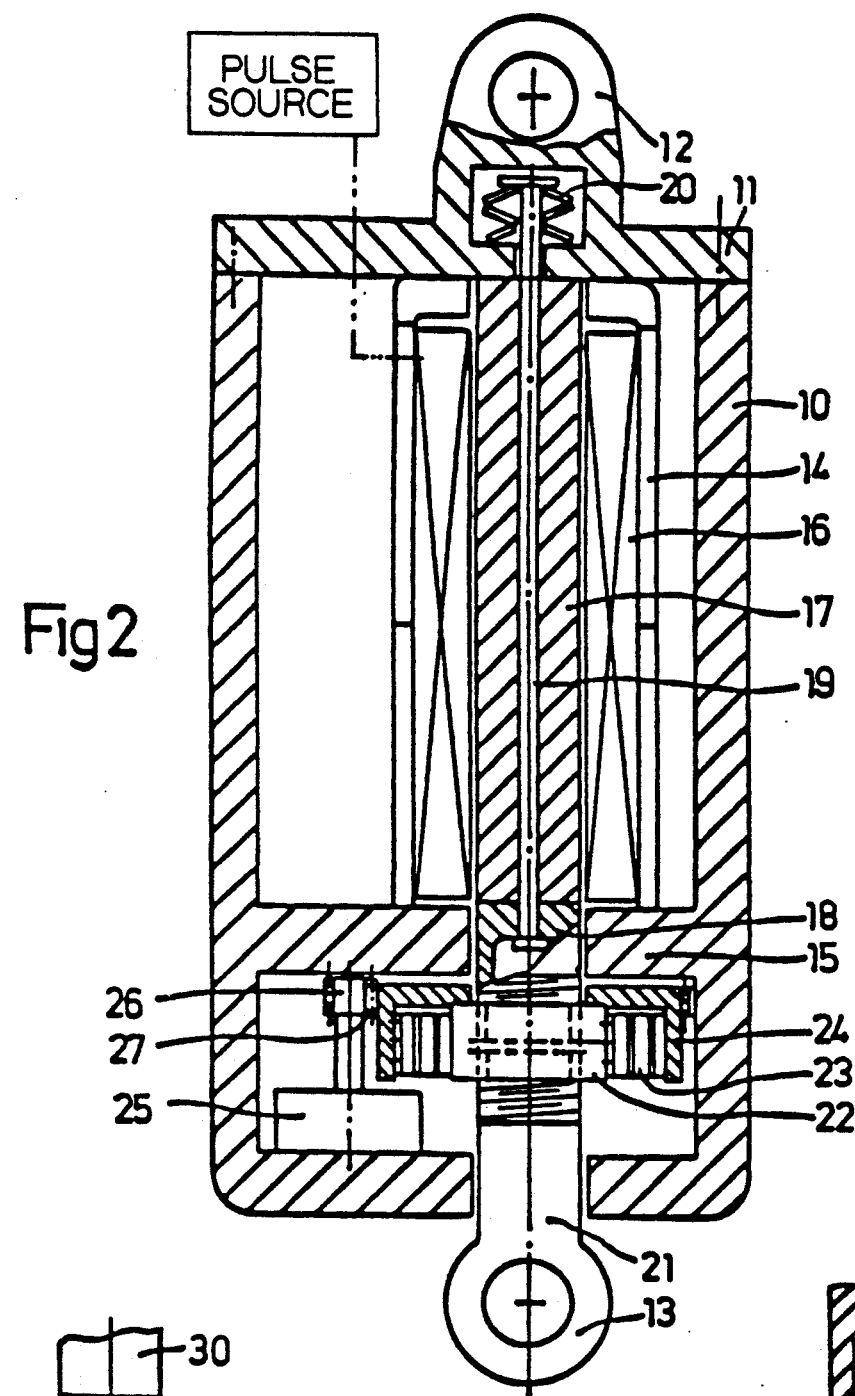
FIG. 2 is a side-view, mostly in section, of a preferred embodiment of an actuator including a movement transforming device according to the invention.

Having now illustrated the principle of the actuator based on the Terfenol material, time has come to describe a practical and preferred embodiment, shown in FIG. 2.

This actuator has a housing 10 with a lid 11 attached thereto. The lid 11 is provided with a fixed ear 12, whereas a movable ear 13 extends out of the housing 10 opposite the fixed ear 12. These ears are to be connected to a disc brake arrangement of the same general type as illustrated in FIG. 1.

A cylindrical permanent magnet 14 is arranged within the housing 10 supported by a partition-wall 15 therein, and a cylindrical coil 16 is provided within the permanent magnet. A rod 17 of Terfenol is arranged within the coil 16.

Coaxially in line with the rod 17 is a drive member in the form of a drive sleeve 18. A pull bar 19 provided with end flanges at both ends extends through holes in the drive sleeve 18, the rod 17 and the lid 11. A compression spring 20 (in the form of a number of belleville springs) is arranged between the lid 11 and the end flange of the bar 19 for the purpose of excerting a pull force in the bar 19 and accordingly providing a prestress in the Terfenol rod 17, which is essential for its intended function.

A movement transforming device for this actuator has the following design;

Coaxially in line with the drive sleeve 18 is a push rod 21, which extends out through the housing 10 and is ended by the ear 13. When the ear 13 is connected to a brake rigging (not shown), the push rod 21 is non-rotatable. The drive sleeve 18 and the push rod 21 are provided with external threads, that are oppositely directed and cooperate with corresponding internal threads in a connection member in the form of a connection ring 22. The respective threads are self-locking but have a pitch that is as great as possible in order to minimize the power required. The connection ring 22 should have a minimal mass inertia for making it easily movable.

The connection ring 22 is normally exposed to a torque (in the direction for pushing the sleeve 18 and rod 21 apart) by means of a clock spring or spiral spring 23. This spring 23 is at its inner end attached to the connection ring 22 and at its outer end to an outer ring 24. This outer ring 24 may be rotated in either direction by means of an electric motor 25 connected by a pinion 26 to a gear ring 27 at the outer periphery purpose to keep the spring 23 tensioned at all times and the secondary purpose to rewind the connection ring 22 by rotation in the direction opposite to that for tensioning the spring. When not operating the electric motor 25 is locked.

The basis for the operation of the disclosed actuator is that the prestressed rod 17 of Terfenol is caused to reciprocate by means of a pulsating magnetic field. Further, there are self-locking means in the form of the connection ring 22 only requiring a small outer force for its operation. The reciprocation frequency for the rod 17 has to be greater than the natural frequency of the brake rigging to which the actuator is connected.

The following discussion is based on the assumptions that an actuator of this kind with a Terfenol rod 17 as the force-generating means has to have an application stroke of some 3-4 mm, an application time of 0.1 s and an application force of 10,000N.

The specific property of the Terfenol material is that its length increases when exposed to a magnetic field; the property is called magnetostriction. The material chosen has a high magnetostriction, namely up to 0.2%, and a very fast response. The material has to be prestressed in order to return to its original dimension when not exposed to the magnetic field.

Calculations have shown that under the following conditions the desired results may be obtained:

A rod 17 with a length of 100 mm and a diameter of 20 mm is under a mechanical prestress of 3700N by the spring 20. This rod is caused to reciprocate at a frequency of 1000 by being exposed to the combination of a constant magnetic field from the permanent magnet 14 of 130 kA/m and pulsating magnetic field from the coil 16 of ±130 kA/m; the resulting positive magnetic field pulsates between zero and 260 kA/m.

For obtaining this magnetic field the coil 16 may have an inner diameter of 22 mm, an outer diameter of 40 mm and a length of 110 mm. The current may be 5 A and the voltage 625 V for obtaining the desired magnetic field with a climbing time of 0.25 ms and a power of 806 W.

Provided that the mass of the brake rigging levers is 15 kg, the force 10,000N and the time for reaching this force 0.25 ms, the final speed will be 83 mm/s and the movement 0.007 mm.

It has been demonstrated that the Terfenol rod 17 reciprocates under the influence of the magnetic field and delivers the desired forces. This reciprocating movement of the drive sleeve 18 is to be transferred to a unidirectional application movement of the push rod 21 by means of the self-locking connection ring 22. The simple principle thereof is to be non-rotational during each small reciprocation movement in the application direction of the Terfenol rod 17 and to increase the distance between the drive sleeve 18 and the push rod 21 by small rotation during each small reciprocation movement in the retraction direction. This small rotation of the connection ring 22 is accomplished by the spring 23.

It is essential that the connection ring 22 has a very low mass inertial and a high thread pitch (in opposite directions). With an outer diameter of 30 mm and an inner diameter of 20 mm and a pitch of 7 mm/turn a torque of less than 4 Nm from the spring 23 is required.

As has already been described, the spring 23 is tensioned by the electric motor 25 or by similar means. The return stroke (by rotating the connection ring 22 in the opposite direction) can also be obtained by the electric motor 25. A more direction transmission of this rotational movement than by the spring 23 can be obtained by providing a one-way clutch between the connection ring 22 and the outer ring 24.

Figure 3:
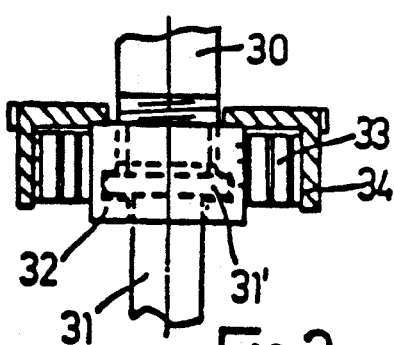
FIGS. 3 and 4 are side-views, partly in section, of two modified devices according to the invention.
Figure 4:
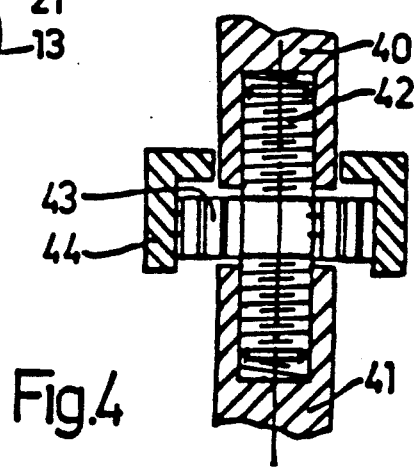

Two modified versions of the movement transforming device are shown in FIGS. 3 and 4.

In the FIG. 3 modification there is a drive member or sleeve 30, a push rod 31, a connection ring 32, a clock or spiral spring 33 and an outer ring 34. The oscillating drive sleeve 30 is in similar thread engagement with the connection ring 32 as in the FIG. 2 version, whereas the connection ring is freely rotatable in relation to, but axially connected to the push rod 31, which for this purpose is provided with a head 31' engaging a corresponding recess in the connection ring 32.

In the FIG. 4 modification the drive member 40 and the push rod 41 are provided with internal threads for self-locking cooperation with external threads of a connection member in the form of a connection rod 42. A clock or spiral spring 43 joins this rod 42 with an outer ring 44.

We claim:

1. A device in a force actuator for transforming a reciprocating axial movement of a drive member to an axial movement in an application direction of a push rod member of a braking system coaxial therewith, comprising in combination means for transferring forces between the drive member and the push rod member by means of connection member rotatable in self-locking thread engagement with one of the members to convert an advancing and idle axial stroke of the drive member into incremental axial movements of the push rod, rotating means subjecting the connection member to a rotational torque rotating during the idle stroke of the reciprocating movement in a direction for advancing the push rod in the brake application direction, reciprocating means for a drive member comprising a prestressed rod of a magnetostrictive material, a surrounding coil, and means for producing a pulsating magnetic field in said coil.

2. A device according to claim 1, wherein said connection member further comprises a connection ring in thread engagement with external thread on the drive member and said rotating means further comprises a prestressed spiral spring.

3. A device according to claim 2, wherein the connection ring is in thread engagement with oppositely directed threads on the drive member and the push rod member.

4. A device according to claim 1, wherein said connection member further comprises a connection rod in thread engagement with oppositely directed threads of the drive member and the push rod member and said rotating means further comprise a prestressed spring.

5. A device according to claim 1 wherein said rotating means further comprises a spiral spring with positioning means comprising a rotatable outer ring coupled for prestressing the spring.

6. A device according to claim 5, further comprising means for rotating the outer ring by means of an electric motor.

7. A device according to claim 1, further comprising reciprocating means for the drive member comprising a prestressed rod of a magnetostrictive material a surrounding coil, and means for producing a pulsating magnetic field in said coil.

8. A brake system with a brake applying push rod comprising in combination a prestressed magnetostrictive rod, a surrounding coil, means for producing a pulsating magnetic field in said coil to reciprocate the length of the magnetostrictive rod and a mechanism for converting the reciprocations in length of the magnetostrictive rod to incremental brake applying movements of said push rod.

* * * * *